United States Patent
Hoshino et al.

(10) Patent No.: US 8,148,771 B2
(45) Date of Patent: *Apr. 3, 2012

(54) SEMICONDUCTOR DEVICE AND METHOD TO MANUFACTURE THEREOF

(75) Inventors: Masataka Hoshino, Tokyo (JP); Ryoto Fukuyama, Tokyo (JP); Koji Taya, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/837,323

(22) Filed: Jul. 15, 2010

(65) Prior Publication Data

US 2010/0276801 A1    Nov. 4, 2010

Related U.S. Application Data

(63) Continuation of application No. 12/217,096, filed on Jul. 1, 2008, now Pat. No. 7,786,587.

(60) Provisional application No. 60/958,084, filed on Jul. 2, 2007.

(51) Int. Cl.
*H01L 21/02* (2006.01)

(52) U.S. Cl. . 257/327; 257/345; 257/359; 257/E21.427; 257/E23.011; 257/E29.119; 438/286; 438/293; 438/301; 438/304

(58) Field of Classification Search .......... 257/327–351, 257/379, 393, 459, E21.427, 597, 23.011, 257/105, 144, 27.016, 99, 29.004, 119, 268; 438/239, 286–304, 689–706

See application file for complete search history.

(56) References Cited

U.S. PATENT DOCUMENTS

| | | | |
|---|---|---|---|
| 5,449,946 A | 9/1995 | Sakakibara et al. | |
| 5,461,501 A * | 10/1995 | Sato et al. | 349/42 |
| 5,780,910 A * | 7/1998 | Hashimoto et al. | 257/393 |
| 5,877,533 A | 3/1999 | Arai et al. | |
| 6,115,090 A | 9/2000 | Yamazaki | |
| 6,437,842 B1 * | 8/2002 | Sato et al. | 349/110 |
| 6,472,293 B1 | 10/2002 | Suga | |
| 6,608,371 B2 | 8/2003 | Kurashima et al. | |
| 6,667,551 B2 | 12/2003 | Hanaoka et al. | |
| 6,803,271 B2 * | 10/2004 | Fujiwara et al. | 438/239 |
| 6,856,023 B2 | 2/2005 | Muta et al. | |
| 7,074,703 B2 | 7/2006 | Fukazawa | |
| 7,094,701 B2 * | 8/2006 | Umemoto et al. | 438/706 |
| 7,095,114 B2 | 8/2006 | Takahashi et al. | |
| 7,138,710 B2 | 11/2006 | Fukazawa | |
| 7,176,520 B2 * | 2/2007 | Miyake et al. | 257/327 |
| 7,307,348 B2 | 12/2007 | Wood et al. | |
| 7,510,941 B2 * | 3/2009 | Hatori et al. | 438/286 |
| 7,616,167 B2 | 11/2009 | Anzai | |
| 2002/0017710 A1 | 2/2002 | Kurashima et al. | |

(Continued)

FOREIGN PATENT DOCUMENTS

JP    2002-050738    2/2002

(Continued)

*Primary Examiner* — Michael Lebentritt

(57) ABSTRACT

A semiconductor device 100 includes a semiconductor substrate 14, a connection electrode 12 disposed on an upper surface of the semiconductor substrate 14 and connected to an integrated circuit thereon, a through electrode 20 which penetrates the semiconductor substrate 14 and the connection electrode 20, and an insulation portion 30 interposed between the semiconductor substrate 14 and the through electrode 20. The through electrode 20 is integrally formed to protrude outward from upper surfaces of the semiconductor substrate 14 and the connection electrode 12, and connected to the connection electrode 12 in a region where the through electrode 20 penetrates the connection electrode 12.

16 Claims, 14 Drawing Sheets

U.S. PATENT DOCUMENTS

2003/0060000 A1 3/2003 Umetsu et al.
2003/0183943 A1 10/2003 Swan et al.
2004/0173909 A1 9/2004 Sinha et al.
2004/0188822 A1 9/2004 Hara
2006/0267206 A1 11/2006 Tanida et al.
2009/0305502 A1 12/2009 Lee et al.

FOREIGN PATENT DOCUMENTS

JP 2005-019521 1/2005
WO 2008/101093 A1 8/2008

* cited by examiner

SEMICONDUCTOR DEVICE AND METHOD TO MANUFACTURE THEREOF

CROSS-REFERENCES TO RELATED APPLICATIONS

This application is a continuation of U.S. patent application Ser. No. 12/217,096, filed on Jul. 1, 2008, entitled "SEMICONDUCTOR DEVICE AND METHOD FOR MANUFACTURE THEREOF," which claims priority from U.S. Provisional Application No. 60/958,084, filed Jul. 2, 2007.

TECHNICAL FIELD

The invention relates to a semiconductor device, and more particularly, to a semiconductor device provided with a through electrode which penetrates a semiconductor substrate, and a method for manufacturing thereof.

BACKGROUND OF THE INVENTION

Recently, accompanied with miniaturization and sophistication of an electronic device, a technique for improving a packaging density of a semiconductor device mounted on the electronic device has been developed. Various kinds of the semiconductor device with the stack structure having a plurality of semiconductor chips stacked have been developed as a high packaging density technique.

Japanese Patent Application Publication No. 2002-50738 (Document 1) and Japanese Patent Application Publication No. 2005-19521 (Document 2) disclose the semiconductor device in which a through hole is formed in the semiconductor chip, and a through electrode separated from the semiconductor chip with the insulation member is disposed inside the through hole. The aforementioned semiconductor device may be electrically coupled with another semiconductor device or the interposer with the solder ball applied onto the connection electrode of the semiconductor chip.

In the semiconductor device disclosed in Documents 1 and 2, the step of forming the through electrode for connecting interconnections on the upper and the lower surfaces of the semiconductor chip is performed independently of the step of forming the solder ball for connecting the semiconductor chip to another semiconductor device or the interposer, resulting in the complicated manufacturing step and the increased manufacturing cost.

SUMMARY OF THE INVENTION

The present invention was devised in light of the foregoing problems, and it is an object of the invention to provide a semiconductor device including a through electrode, which may be produced through the simplified manufacturing step, and the method for manufacturing thereof.

According to an aspect of the present invention, there is provided a semiconductor device which includes a semiconductor substrate, a connection electrode disposed on an upper surface of the semiconductor substrate and connected to an integrated circuit on the semiconductor substrate, a through electrode which penetrates the semiconductor substrate and the connection electrode, and an insulation portion interposed between the semiconductor substrate and the through electrode. The through electrode is integrally formed to protrude outward from upper surfaces of the semiconductor substrate and the connection electrode, and connected to the connection electrode in a region where the through electrode penetrates the connection electrode.

According to another aspect of the present invention, there is provided a method for manufacturing a semiconductor device including bonding a first support member formed of a support base material and a support adhesive agent on an upper surface of a semiconductor substrate provided with a connection electrode by directing the support adhesive agent downward, forming a first through hole which penetrates the semiconductor substrate, forming an insulation portion inside the first through hole, forming a second through hole which vertically penetrates the insulation portion and the connection electrode, and further penetrates the support adhesive agent inside the first through hole, and integrally forming a through electrode in a region corresponding to the semiconductor substrate, the connection electrode and the support adhesive agent inside the second through hole.

DETAILED DESCRIPTION

Figure 1A:
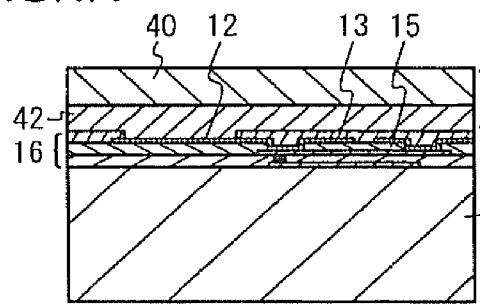
FIGS. 1A through 1E illustrate a method for manufacturing a semiconductor device according to a first embodiment.

Hereinafter, embodiments according to the present invention will be described referring to the drawings.
First Embodiment A method for manufacturing a semiconductor device according to a first embodiment will be described referring to FIGS. 1A through 1E. Each of FIGS. 1A through 1E is a cross-sectional view showing an enlarged portion around a through electrode of the semiconductor device according to the first embodiment. Referring to FIG. 1A, an interconnection 13 formed of copper, aluminum, or the like, and an interconnection layer 16 formed of an insulation layer 15 formed of a silicon oxide or the like are formed on the upper surface of a semiconductor substrate 14 formed of silicon.

The interconnection layer 16 contains a connection electrode 12 as a region where a through electrode 20 (not shown in FIG. 1A, see FIG. 1E) is formed in the subsequent step of a manufacturing method. The connection electrode 12 is formed to be directly connected to the through electrode 20 (see FIG. 2) to be described later. The interconnection layer 16 partially forms an integrated circuit (the circuit including the transistor or memory, for example) formed on the semiconductor substrate 14, and is electrically coupled with the connection electrode 12.

As shown in FIG. 1A, a first support member 43 formed by applying a support adhesive agent 42 as an acrylic adhesive agent to a support base material 40 formed of a polyester is bonded to an upper surface of the semiconductor substrate 14 by directing the side of the support adhesive agent 42 downward. The first support member 43 is provided for supporting the semiconductor substrate 14 and the interconnection layer 16 in the subsequent step of forming a through hole. The first support member 43 may be formed of any material so long as the same function as described above is obtained. The support adhesive agent 42 has a predetermined thickness (for example, 20 mm) to allow the through electrode to protrude from the upper surface of the semiconductor substrate 14 in the subsequent step.

Figure 1D:
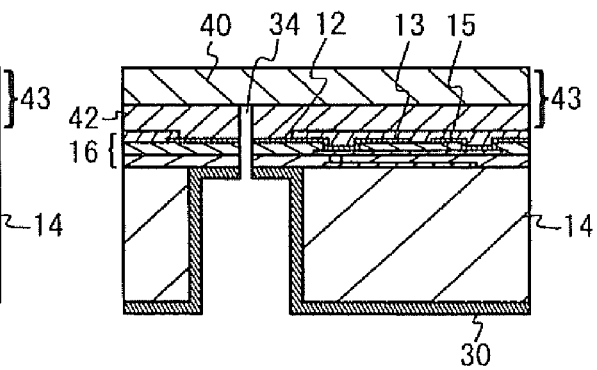
Figure 1B:
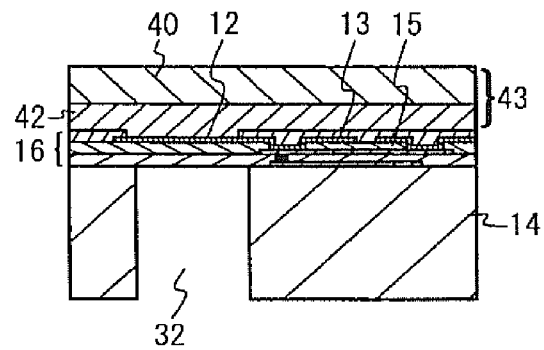

Referring to FIG. 1B, a first through hole 32 is formed in the semiconductor substrate 14 so as to at least penetrate therethrough. The first through hole 32 may have any cross section shape (in parallel with the upper surface of the semiconductor substrate 14) but is required to have the size (for example, circle with a diameter of 40 mm) which accommodates the through electrode inside the first through hole 32 in the subsequent step. As shown in the drawing, the first through hole 32 may be formed to the region in contact with the interconnection layer 16, or to penetrate the interconnection layer 16. The first through hole 32 is formed through the laser irradiation or dry etching to eliminate the corresponding portion of the semiconductor substrate 14 from the lower surface thereof. Alternatively, the lower surface of the semiconductor substrate 14 is polished to have the predetermined thickness so as to form the first through hole 32. In the first embodiment, the total thickness of the semiconductor substrate 14 and the interconnection layer 16 is set to 50 mm.

Figure 1E:
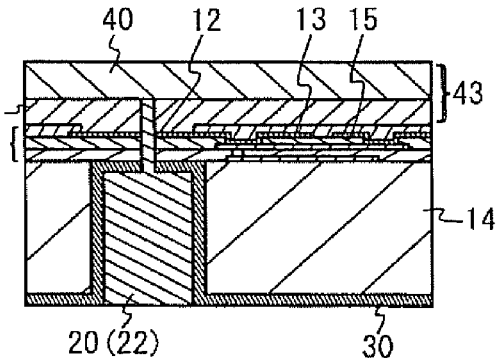
Figure 1C:
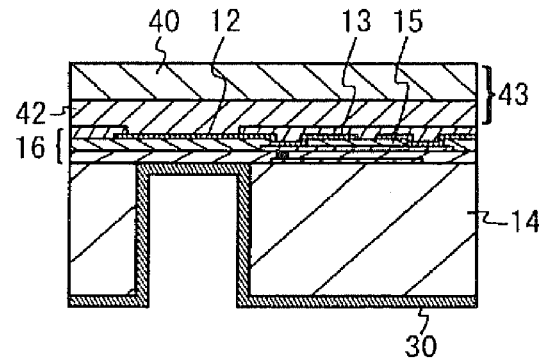

Referring to FIG. 1C, an insulation portion 30 is applied to an inner surface of the first through hole 32 and the lower surface of the semiconductor substrate 14. The insulation portion 30 is formed in order to electrically insulate the through electrode 20 (not shown in FIG. 1C, see FIG. 1E) formed in the step (to be described later) from the semiconductor substrate 14, and is formed of such member as a resin, an oxide film and a nitride film is applied at least to an entire inner surface of the first through hole 32. The insulation film 30 may be formed as a thin film through a chemical vapor deposition (CVD) process so as to be applied to the inner wall of the first through hole 32 (see FIG. 1C). In addition, such portion may be formed by coating a liquid insulation member (spin coat, for example). Furthermore, such portion may be formed so as to entirely fill the first through hole 32.

Referring to FIG. 1D, a second through hole 34 is formed inside the first through hole 32 to vertically penetrate the insulation portion 30 and the connection electrode 12, and to further penetrate the support adhesive agent 42. In the case where the film-like insulation portion 30 is formed as shown in FIG. 1C, the second through hole 34 may be formed by combining a hollow portion inside the first through hole 32 resulting from etching of the insulation portion 30 on the upper surface of the first through hole 32 and a hollow portion separately formed as shown in FIG. 1D. The second through hole 34 is formed so as to penetrate at least the semiconductor substrate 14, the connection electrode 12, and the support adhesive agent 42 to reach the support base material 40 from the lower surface of the semiconductor substrate 14. A cross section of the second through hole 34 may have any shape, but is required to have the size smaller than that of the first through hole 32. As shown in the drawing, it is preferable to form the second through hole 34 to reach the region in contact with the support base material 40. However, the second through hole 34 may be formed to penetrate the support base material 40 to a slight extent. The second through hole 34 is formed through the laser irradiation or dry etching from the lower surface of the semiconductor substrate 14 to eliminate the respective regions of the insulation portion 30, the connection electrode 12, and the support adhesive agent 42.

Referring to FIG. 1E, the through electrode 20 is formed inside the second through hole 34 so as to be electrically coupled with the connection electrode 12. The through electrode 20 is integrally formed with the region corresponding to at least the semiconductor substrate 14, the connection electrode 12 and the support adhesive agent 42 inside the second through hole 34. As shown in the drawing, the through electrode 20 is electrically coupled with the connection electrode 12 at the portion where the through electrode 20 penetrates the connection electrode 12. It is preferable to use the member with high conductivity such as copper for forming the through electrode 20. The through electrode 20 is formed by filling the copper paste 22 in the second through hole 34 from the lower surface. In addition, the through electrode 20 may also be formed through the plating.

Figure 2:
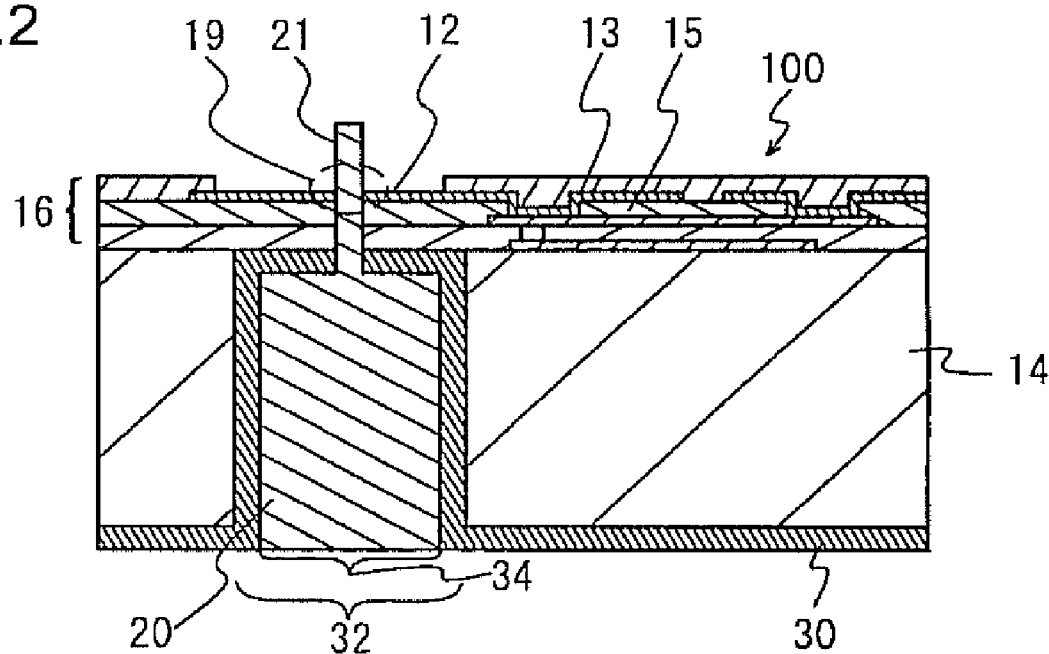
FIG. 2 is a sectional view showing a structure of the semiconductor device according to the first embodiment.

Referring to FIG. 2, the support base material 40 and the support adhesive agent 42 are eliminated after forming the through electrode 20. As a result, the upper portion of the through electrode 20 protrudes from the upper surfaces of the semiconductor substrate 14 and the connection electrode 12 to be formed as a bump 21. A semiconductor device 100 according to the first embodiment is then produced in the aforementioned steps.

FIG. 2 is a sectional view of the semiconductor device 100 according to the first embodiment. The connection electrode 12 is formed on the upper surface of the semiconductor substrate 14 and electrically coupled with the interconnection layer 16 which partially forms an integrated circuit. The through electrode 20 is formed in the semiconductor substrate 14 to penetrate through the semiconductor substrate 14 as well as the connection electrode 12. The through electrode 20 is integrally formed to penetrate the semiconductor substrate 14 and the connection electrode 12 vertically from the lower surface of the semiconductor substrate 14, and to protrude from the upper surfaces of the semiconductor substrate 14 and the connection electrode 12. The through electrode 20 contacts the connection electrode 12 so as to be electrically coupled therewith in a region 19, where the penetration electrode 20 penetrates the connection electrode 12. The insulation portion 30 formed of the insulating resin is applied to the space between the semiconductor substrate 14 and the through electrode 20, and the lower surface of the semiconductor substrate 14.

Referring to FIG. 2, the structure of the semiconductor device 100 will be described in more detail. The semiconductor device 100 according to the first embodiment includes the first through hole 32 which penetrates the semiconductor substrate 14. The insulation portion 30 is formed on the inner surface of the first through hole 32. The second through hole 34 which vertically penetrates the insulation portion 30 is formed. The insulation portion 30 may be formed as the film as shown in the drawing, or formed by filling the first through hole 32 to be described later. The through electrode 20 is provided inside the second through hole 34.

In the semiconductor device 100 according to the first embodiment, the upper portion of the through electrode 20 protrudes from the upper surfaces of the semiconductor substrate 14 and the connection electrode 12 to form the bump 21. This makes it possible to be electrically coupled the semiconductor device 100 with another semiconductor device via the bump 21. As the through electrode 20 protrudes from the upper surface of the semiconductor device 100, it may be easily brought into contact with the electrode of another semiconductor device or interposer. In the case where the contact surface has a concavo-convex shape, the bump 21 may be crushed in contact with such surface to absorb the irregularity in the height of the connection surface. Accordingly, the semiconductor device 100 may be connected to another semiconductor device or the interpose in the stable manner.

The through electrode 20 may be formed to have any structure so long as it protrudes at least from the upper surface of the semiconductor device 100 so as to be electrically coupled with the electrode of another semiconductor device or the interposer. For example, the through electrode 20 may be structured to protrude from the upper surface of the insulating resin which covers the upper surfaces of the semiconductor substrate 14 and the interconnection layer 16 (connection electrode 12).

In the first embodiment, the etching is performed not only to the insulation portion 30 and the connection electrode 12 but also to the support adhesive agent 42 upon formation of the second through hole 34 for forming the through electrode 20. As a result, the bump 21 is formed in the region corresponding to the support adhesive agent 42 in the second through hole 34 simultaneously with formation of the through electrode 20. The through electrode 20 is electrically coupled with the connection electrode 12 in the region where the through electrode 20 penetrates the connection electrode 12. In this manner, the formation of the through electrode 20 and the bump 21, and the electrical coupling between the through electrode 20 and the connection electrode 12 may be performed in a single step, thus simplifying the manufacturing step. The process which uses the support base material 40 and the support adhesive agent 42 does not require formation of a mask for forming the bump 21, thus reducing a manufacturing cost.

According to the first embodiment, the case where the interconnection 13 serves as the connection electrode 12 is described. However, the connection electrode 12 is not limited to the aforementioned structure. For example, the connection electrode 12 may be formed separately from the interconnection 13 according to the fifth embodiment to be described later.

Second Embodiment

Figure 3:
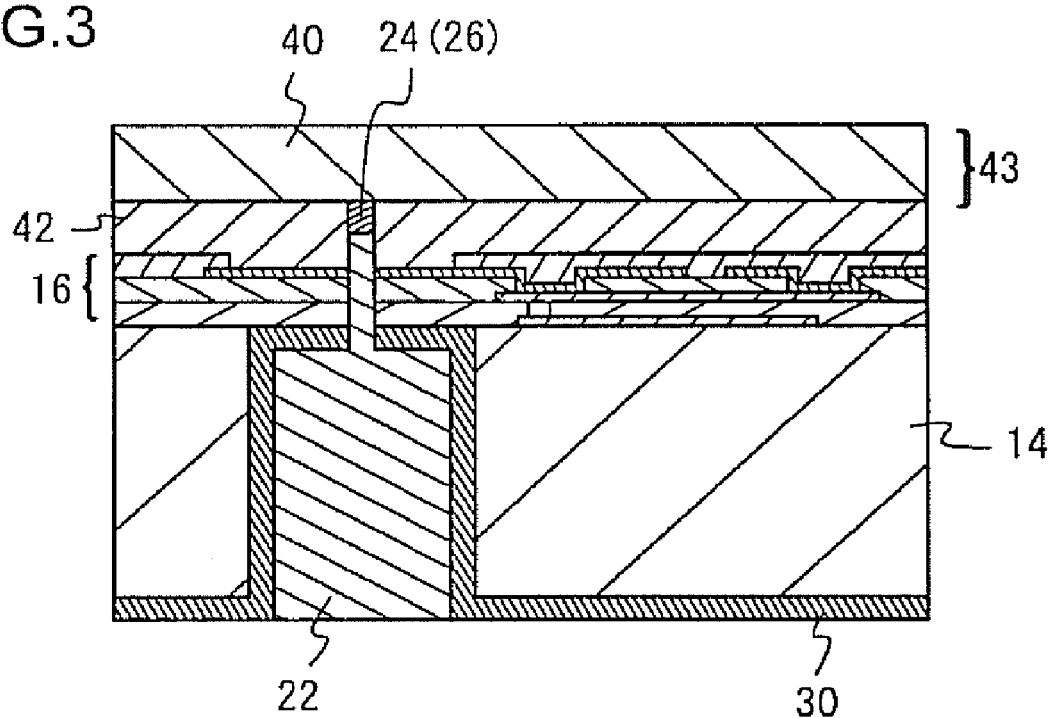
FIG. 3 illustrates a method for manufacturing a semiconductor device according to a second embodiment.

In a second embodiment, a solder bonding bump is formed on the upper surface of the through electrode. FIG. 3 illustrates a method for manufacturing a semiconductor device according to a second embodiment and corresponds to FIG. 1E according to the first embodiment. The manufacturing steps prior to the one corresponding to those shown in FIG. 3 are the same as those of the manufacturing steps of the first embodiment, and explanations thereof, thus will be omitted. Referring to FIG. 3, a bonding paste 26 as a solder paste is buried in a region corresponding to the support adhesive agent 42 above the second through hole 34. After the bonding paste 26 is solidified to form a first bonding bump 24, a copper paste 22 is then filled in the second through hole 34. Thereafter, the support base material 40 and the support adhesive agent 42 are eliminated to produce a semiconductor device 102 according to the second embodiment.

Figure 4:
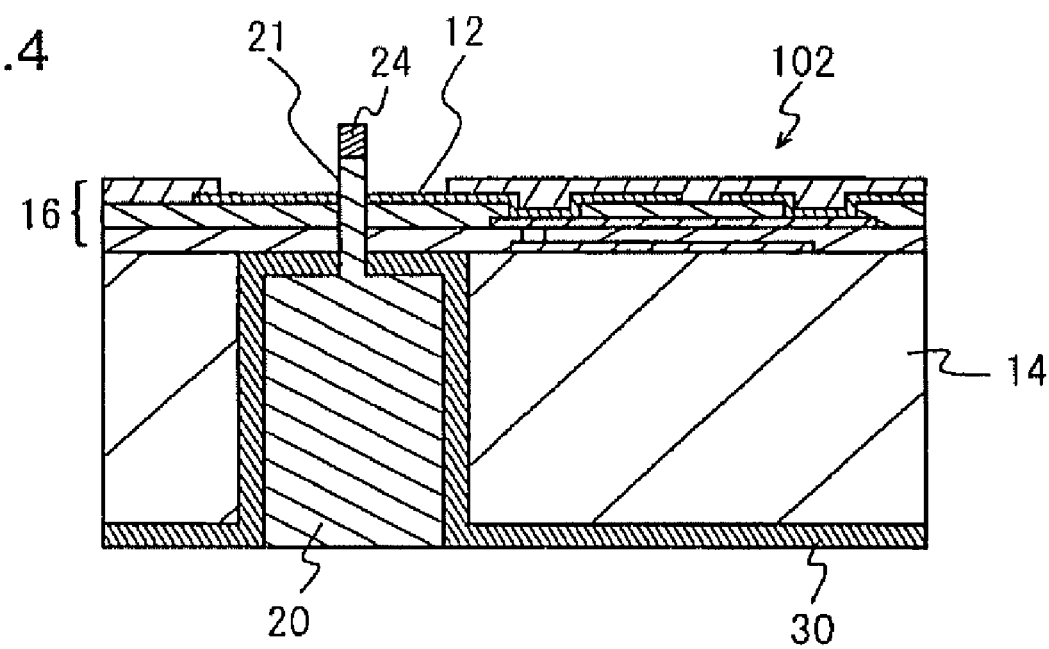
FIG. 4 is a sectional view showing a structure of the semiconductor device according to the second embodiment.

FIG. 4 is a sectional view showing the structure of the semiconductor device 102 according to the second embodiment. The first bonding bump 24 is formed on the upper surface of the through electrode 20. It is preferable to set the planar size of the first bonding bump 24 to be equal to or smaller than that of the through electrode 20. The other structure is the same as that of the first embodiment, and the explanation thereof, thus will be omitted.

The semiconductor device 102 according to the second embodiment has the first bonding bump 24 formed on the upper surface of the through electrode 20. The melting point of the first bonding bump 24 is lower than that of the through electrode 20 so as to be mechanically and electrically connected to the electrode of another semiconductor device or the interposer. This makes it possible to improve the stability on the connection surface compared with the connection by only the through electrode 20.

In the second embodiment, the first bonding bump 24 is formed using the second through hole 34 for forming the through electrode 20. Therefore, the mask for forming the first bonding bump 24 is not required to be formed, thus simplifying the manufacturing step and reducing the cost.

The solder of tin-silver type or tin-silver-copper type is used for forming the first bonding bump 24. In the second embodiment, the bonding paste 26 is filled in the second through hole 34 to form the first bonding bump 24. Alternatively, the first bonding bump 24 may be formed through plating.

Third Embodiment

In a third embodiment, the support member including a stopper layer is used in the method for manufacturing the semiconductor device 100 according to the first embodiment. FIGS. 5A through 5E illustrate a method for manufacturing a semiconductor device according to a third embodiment and correspond to FIGS. 1A to 1E according to the first embodiment. The same structures as those of the first embodiment will be designated with the same codes, and the explanations thereof, thus will be omitted.

Figure 5A:
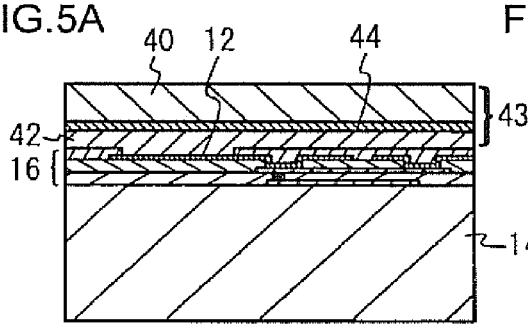
FIGS. 5A through 5E illustrate a method for manufacturing a semiconductor device according to a third embodiment.

Referring to FIG. 5A, a first support member 43a having a stopper layer 44 interposed between the support base material 40 and the support adhesive agent 42 is bonded to the upper surface of the semiconductor substrate 14 by directing the support adhesive agent 42 downward. The stopper layer 44 serves to stop etching in the step of forming the second through hole 34 to be described later. The stopper layer 44 is formed of the member which is unlikely to be etched through laser irradiation or dry etching, for example, the metal layer formed of copper.

Figure 5D:
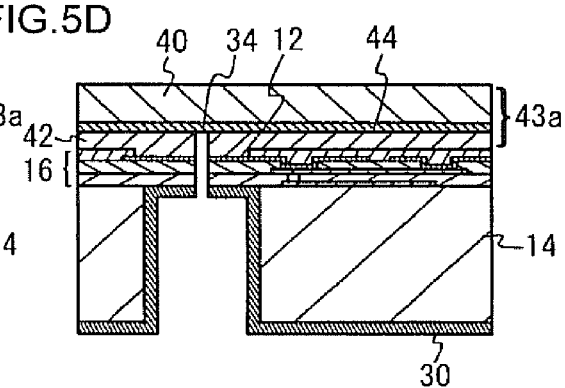
Figure 5B:
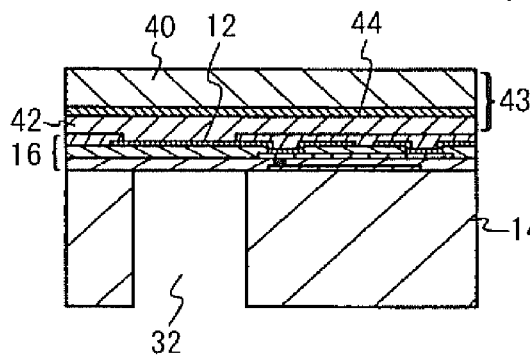

As shown in FIG. 5B, the steps for forming the first through hole 32 and forming the insulation portion 30 on the inner surface of the first through hole 32 are the same as those described in the first embodiment.

The second through hole 34 which penetrates the insulation portion 30, the connection electrode 12 and the support adhesive agent 42 to reach the stopper layer 44 is formed inside the first through hole 32 as shown in FIG. 5D. Likewise the first embodiment, the second through hole 34 is formed through laser irradiation or dry etching. The etching is blocked by the stopper layer 44 formed of the material which is unlikely to be etched. Therefore, the second through hole 34 is formed from the lower surface of the semiconductor substrate 14 to the lower surface of the stopper layer 44 without penetrating the stopper layer 44.

Figure 5E:
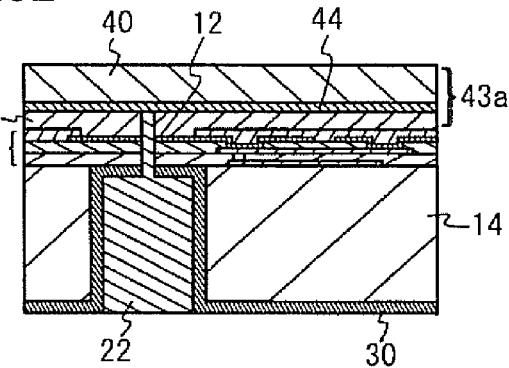
Figure 5C:
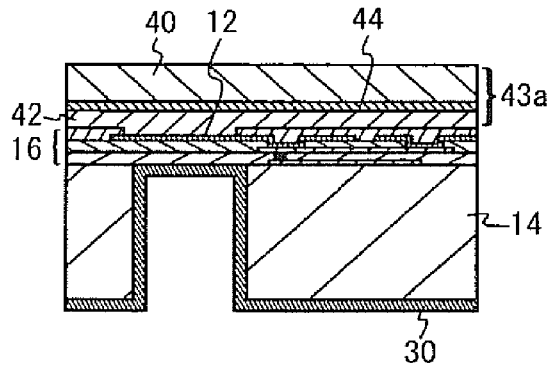

Likewise the first embodiment, the copper paste 22 is filled into the second through hole 34 as shown in FIG. 5E to form the through electrode 20. Thereafter, the first support member 43a formed of the support base material 40, the support adhesive agent 42 and the stopper layer 44 is eliminated to produce the semiconductor device according to the third embodiment. The structure of the semiconductor device according to the third embodiment is the same as that of the semiconductor device 100 according to the first embodiment as shown in FIG. 2.

In the third embodiment, the use of the first support member 43a having the stopper layer 44 interposed between the support base material 40 and the support adhesive agent 42 allows the stopper layer 44 to block etching for forming the second through hole 34. This may prevent the support base material 40 from being penetrated upon the etching, thus allowing the second through hole 34 to be formed in the stable manner. In addition, the height of the bump 21 of the through electrode 20 may be set to the predetermined value.

Fourth Embodiment

In a fourth embodiment, the bonding bump is formed on the lower surface of the through electrode 20. FIGS. 6A through 6F illustrate a method for manufacturing a semiconductor device 104 according to the fourth embodiment. The same structures as those described in the first to the third embodiments will be designated with the same codes, and the explanations thereof, thus will be omitted.

Figure 6A:
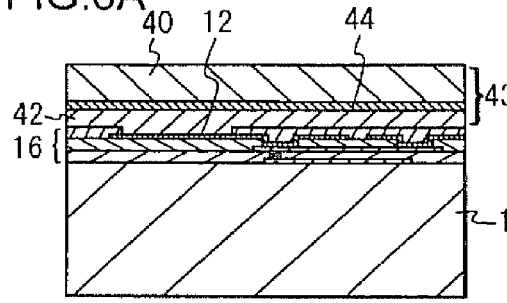
FIGS. 6A through 6F illustrate a method for manufacturing a semiconductor device according to a fourth embodiment.
Figure 6D:
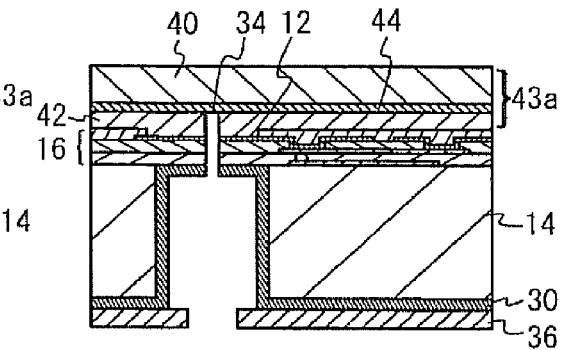
Figure 6B:
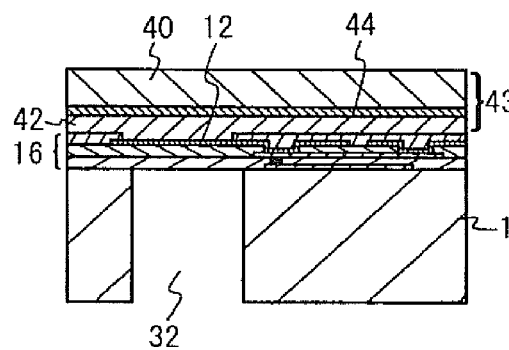

In the process shown in FIGS. 6A and 6B corresponding to that shown in FIGS. 5A and 5B according to the third embodiment, the first support member 43a including the stopper layer 44 is bonded to the upper surface of the semiconductor substrate 14, and the first through hole 32 is formed in the semiconductor substrate 14.

Figure 6E:
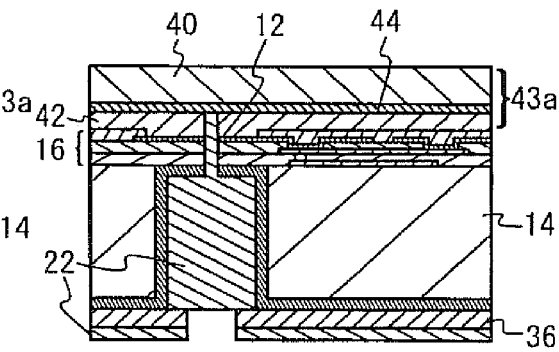
Figure 6C:
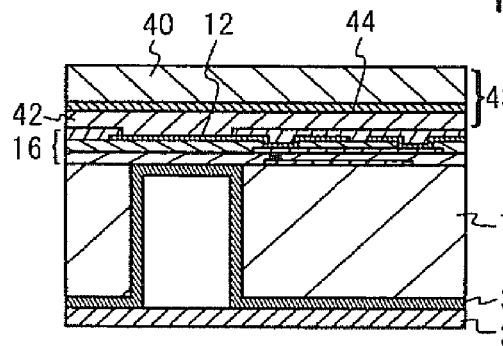

The insulation portion 30 is formed on the inner surface of the first through hole 32 and the lower surface of the semiconductor substrate 14 as shown in FIG. 6C. Thereafter, a second support member 36 as a polyimide tape is bonded to the lower surface of the semiconductor substrate 14 via the insulation portion 30. The second support member 36 serves to support the semiconductor substrate 14 in place of the first support member 43a in the step of forming the second bonding bump to be described later. The second support member 36 is formed of the member which resists the temperature (for example, 230° C.) to form the bonding bump.

The second through hole 34 which penetrates the second support member 36, the insulation portion 30, the connection electrode 12 and the support adhesive agent 42 is formed as shown in FIG. 6D. Referring to the drawing, the second through hole 34 in the support adhesive agent 42 may be formed to have the size different from that of the second through hole 34 in the second support member 36.

As shown in FIG. 6E, the copper paste 22 is filled in the second through hole 34 using the second support member 36 as a mask to form the through electrode 20. The second support member 36 prevents the contact between the copper paste 22 and the insulation portion 30 on the lower surface of the semiconductor substrate 14.

Figure 6F:
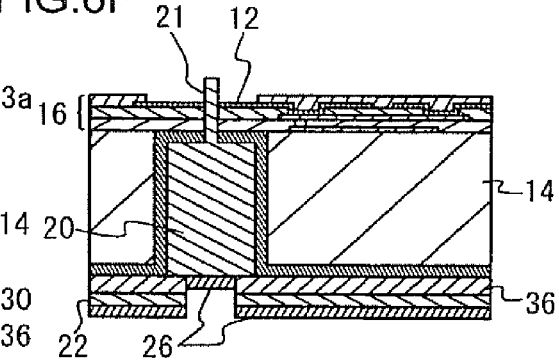

The first support member 43a formed of the support base material 40, the support adhesive agent 42 and the stopper layer 44, which cannot resist the temperature to form the bonding bump (for example, 230° C.), is eliminated as shown in FIG. 6F. In this case, the second support member 36 supports the semiconductor substrate 14, thus preventing the crack of the semiconductor substrate 14. A second bonding bump 28 is then formed on the lower surface of the through electrode 20 using the second support member 36 as a mask. The second bonding bump 28 may be formed by printing the bonding paste 26 on the lower surface of the semiconductor substrate 14 and performing the reflow at 230° C. for 5 minutes. Thereafter, the second support member 36 is peeled off to eliminate the copper paste 22 and the bonding paste 26 adhered on the lower surface of the second support member 36 simultaneously. In this manner, a semiconductor device 104 according to the fourth embodiment is produced.

Figure 7:
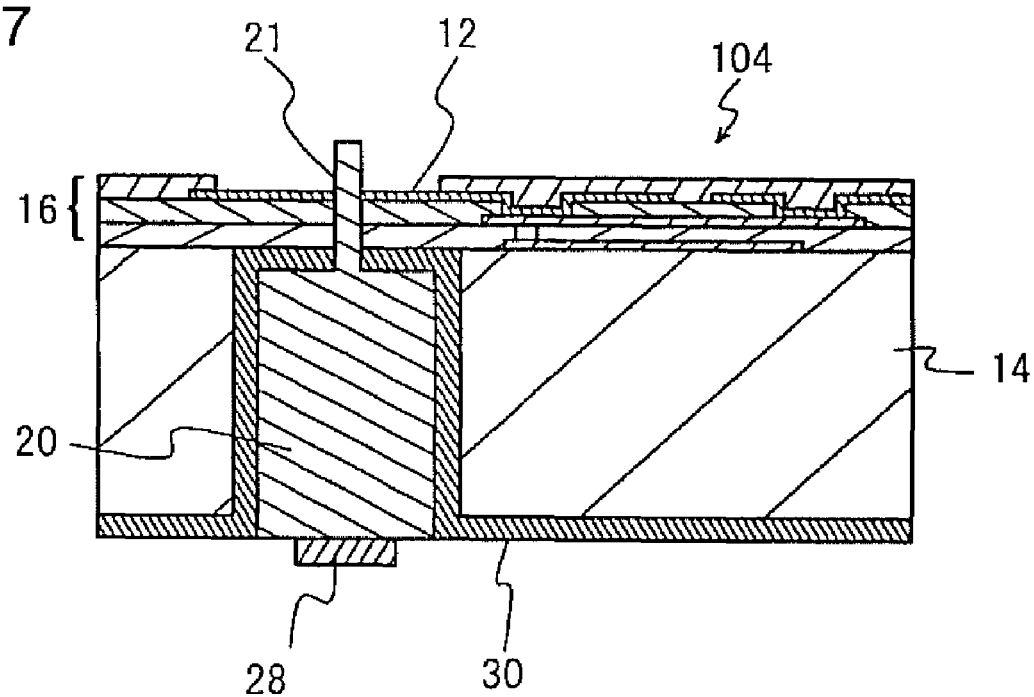
FIG. 7 is a sectional view showing a structure of the semiconductor device according to the fourth embodiment.

FIG. 7 is a sectional view showing the structure of the semiconductor device 104 according to the fourth embodiment. The second bonding bump 28 is formed on the lower surface of the through electrode 20. The planar size of the second bonding bump 28 is smaller than that of the through electrode 20. The other structures of the embodiment are the same as those of the first embodiment as shown in FIG. 2, and the explanations thereof, thus will be omitted.

The semiconductor device 104 according to the fourth embodiment is provided with the second bonding bump 28 on the lower surface of the through electrode 20. The second bonding bump 28 makes it easy to connect the semiconductor device 104 to another semiconductor device or the interposer.

In the fourth embodiment, the copper paste 22 is filled to form the through electrode 20 using the second support member 36 as a mask. The photo mask may be used for forming the through electrode 20 to prevent adhesion of the copper paste 22 to the insulation portion 30 formed on the lower surface of the semiconductor substrate 14. However, the use of the photo mask requires the cost higher than the one required by the use of the second support member 36 as the mask, thus reducing the manufacturing costs.

In the fourth embodiment, as the second bonding bump 28 is formed using the second support member 36 as the mask, the mask for forming the second bonding bump 28 is not required to be formed. This makes it possible to simplify the manufacturing step and to reduce the manufacturing costs.

Fifth Embodiment

In a fifth embodiment, the step of forming the through hole is modified. FIGS. 8A through 8E illustrate the step of manufacturing a semiconductor device 105 according to the fifth embodiment. The same structures as those of the first to the fourth embodiments will be designated with the same codes, and explanations thereof, thus will be omitted.

Figure 8A:
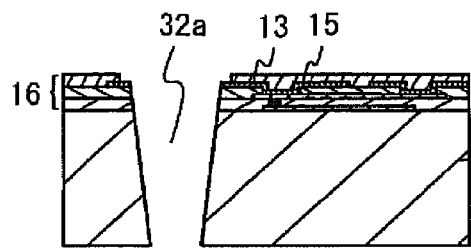
FIGS. 8A through 8E illustrate a method for manufacturing a semiconductor device according to a fifth embodiment.

The interconnection layer 16 is formed on the upper surface of the semiconductor substrate 14 as shown in FIG. 8A. A first through hole 32a which penetrates the interconnection layer 16 and the semiconductor substrate 14 is formed from the upper surface to the lower surface of the semiconductor substrate 14. The first through hole 32a is tapered toward the lower surface of the semiconductor substrate 14. The first through hole 32a may be formed through laser irradiation or dry etching.

Figure 8D:
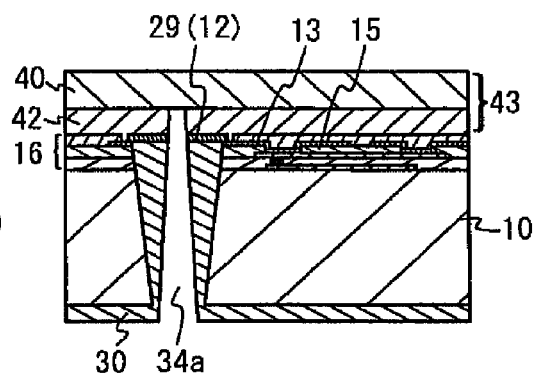
Figure 8B:
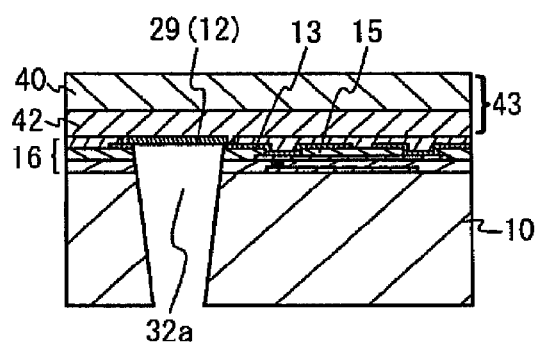

The first support member 43 formed of the support base material 40 and the support adhesive agent 42 is bonded to the upper surface of the semiconductor substrate 14 as shown in FIG. 8B. Thereafter, a thin bonding layer 29 (connection electrode 12) formed of the solder, for example, is formed in the region where the interconnection layer 16 is cut as shown in FIG. 8A. Therefore, the interconnection 13 which has been cut is connected again to form the connection electrode 12.

Figure 8E:
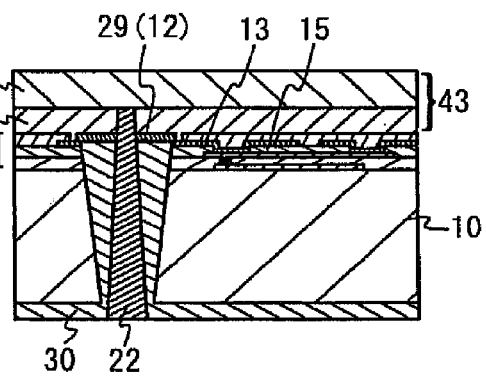
Figure 8C:
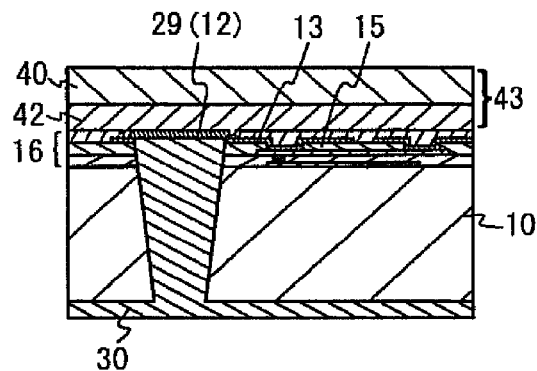

The insulation portion 30 is formed inside of the first through hole 32a and on the lower surface of the semiconductor substrate 14 as shown in FIG. 8C. Unlike the first to the fourth embodiments, inside the first through hole 32a is filled with the insulation portion 30, which is formed of an organic insulating resin, for example.

The insulation portion 30, the bonding layer 29 (connection electrode 12) and the support adhesive agent 42 are eliminated from the lower surface to the upper surface of the semiconductor substrate 14 to form a second through hole 34a as shown in FIG. 8D. The second through hole 34a is tapered in the direction from the lower surface to the upper surface of the semiconductor substrate 14. In addition, the second through hole 34a is formed through laser irradiation or dry etching from the lower surface thereof. Specifically, the first through hole 32a and the second through hole 34a are formed from the opposite directions.

The second through hole 34a is filled with the copper paste 22 to form a through electrode 20a as shown in FIG. 8E. Thereafter, the first support member 43 formed of the support base material 40 and the support adhesive agent 42 is eliminated to produce a semiconductor device 105 according to the fifth embodiment.

Figure 9:
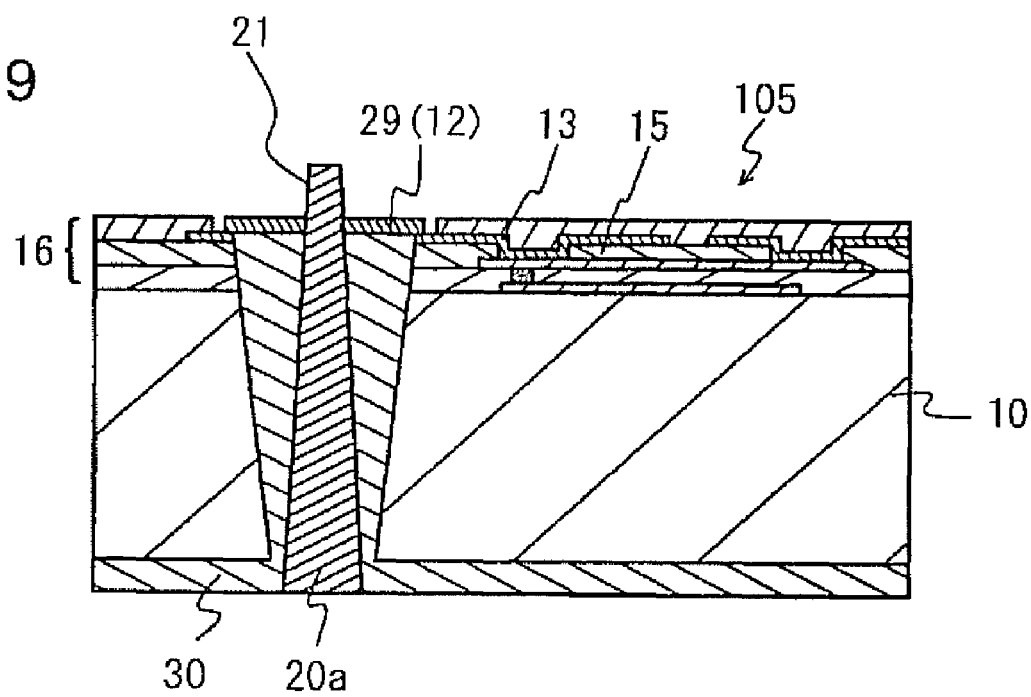
FIG. 9 is a sectional view showing a structure of the semiconductor device according to the fifth embodiment.

FIG. 9 is a sectional view showing the structure of the semiconductor device 105 according to the fifth embodiment. The first through hole 32a is tapered in the direction from the upper surface to the lower surface of the semiconductor substrate 14. The second through hole 34a is tapered in the direction from the lower surface to the upper surface of the semiconductor substrate 14. The second through hole 34a is provided with the through electrode 20a so as to be connected to the connection electrode 12 via the bonding layer 29. Likewise the second through hole 34a, the through electrode 20a is tapered in the direction from the lower surface to the upper surface of the semiconductor substrate 14. The insulation portion 30 is provided so as to fill the first through hole 32a. The other structures are the same as those of the first embodiment, and the explanations thereof, thus will be omitted.

Figure 10A:
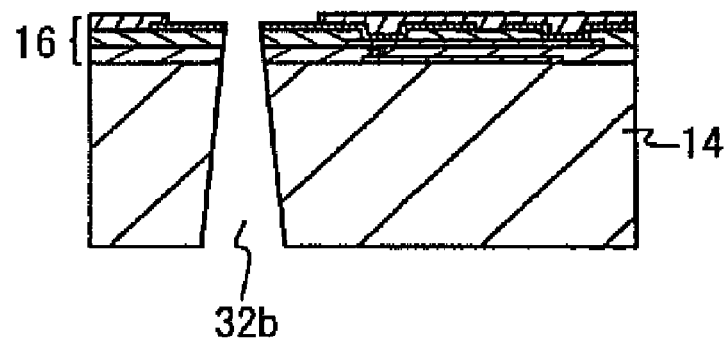
FIGS. 10A through 10C illustrate a method for manufacturing a semiconductor device according to a comparative example of the fifth embodiment.
Figure 10B:
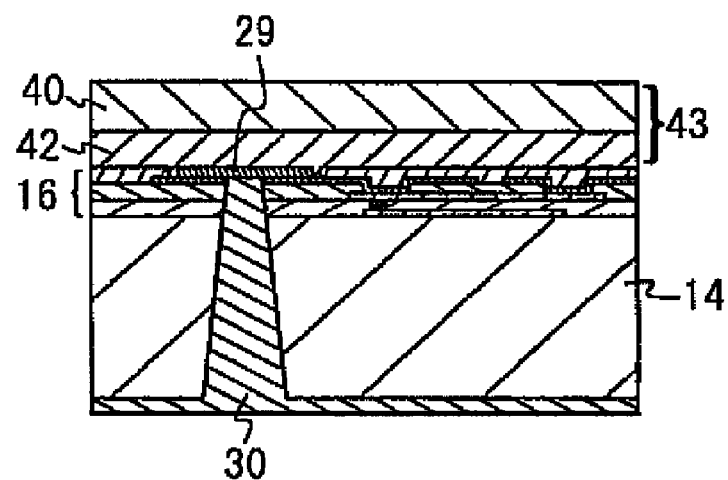
Figure 10C:
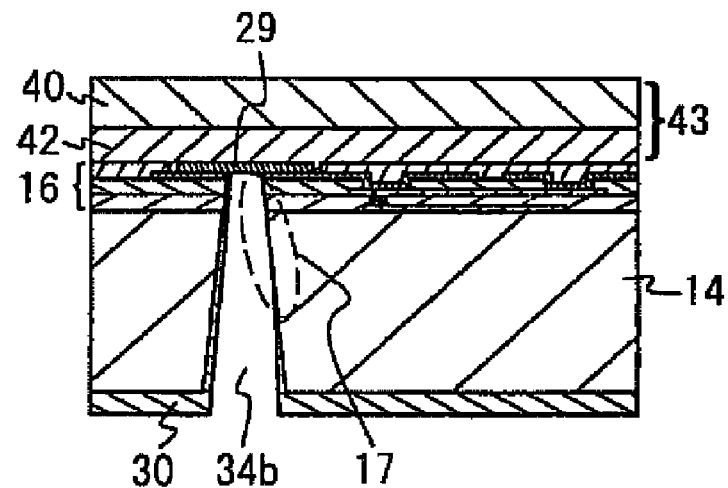

FIGS. 10A through 10C illustrate the part of the step of manufacturing the semiconductor device as a comparative example of the fifth embodiment and correspond to FIGS. 9A through 9D. In the semiconductor device according to the comparative example, the etching is performed from the lower surface of the semiconductor substrate 14 to form the first through hole 32b as shown in FIG. 10A. Then the first support member 43 is bonded to form the bonding layer 29 and the insulation portion 30 as shown in FIG. 10B. Thereafter, the etching is performed from the lower surface of the semiconductor substrate 14 again to form the second through hole 34b as shown in FIG. 10C.

In the comparative example, both the first and the second through holes 32b and 34b are formed by etching from the lower surface of the semiconductor substrate 14 as shown in FIG. 10C. Generally, in the case of forming the through hole by performing the laser irradiation or dry etching, the resultant through hole is likely to be tapered in the direction away from the surface where the etching starts. Referring to FIG. 10C, both the first and the second through holes 32b and 34b are likely to be tapered in the direction from the lower surface to the upper surface of the semiconductor substrate 14. Accordingly, the insulation portion 30 applied on the side surface of the first through hole 32b may be cut in the course of the etching for forming the second through hole 34b to expose the semiconductor substrate 14. For example, FIG. 10C shows that the insulation portion 30 is overetched due to rightward displacement of the laser irradiation axis upon formation of the second through hole 34b to expose the semiconductor substrate 14 around a region 17. The aforementioned case is likely to occur especially when the first through hole 32b has the diameter close to that of the through hole 34b. When the semiconductor substrate 14 is exposed outside from the insulation portion 30 applied on the side surface of the first through hole 32b, the copper paste 22 to be filled in the subsequent step of forming the through electrode 20 is brought into contact with the semiconductor substrate 14, resulting in the conduction between the semiconductor substrate 14 and the through electrode 20.

In the step of manufacturing the semiconductor device 105 according to the fifth embodiment, the first through hole 32a is formed from the upper surface to the lower surface of the semiconductor substrate 14, and the second through hole 34a is formed from the lower surface to the upper surface. The resultant first through hole 32a is tapered in the direction from the upper surface to the lower surface, and the second through hole 34a is tapered in the direction from the lower surface to the upper surface. This makes it possible to prevent the insulation portion 30 formed on the side surface of the first through hole 32a from being cut by etching upon formation of the second through hole 34a. The etching for forming the second through hole 34a is performed from the direction opposite the direction of etching for forming the first through hole 32a. This makes it possible to effectively insulate the through electrode 20 from the semiconductor substrate 14.

For etching from the lower surface of the semiconductor substrate 14, the special device for IR radioscopy or positioning from the lower surface is required. However, the etching to form the first through hole 32a is performed from the upper surface of the semiconductor substrate 14. This makes it possible to easily perform the positioning without using the aforementioned special device. The positioning for etching to form the second through hole 34a may also be easily performed in reference to the first through hole 32a. Furthermore, the inspection whether or not the insulation portion 30 has been destroyed may be easily conducted after forming the second through hole 34a.

Sixth Embodiment

Figure 11:
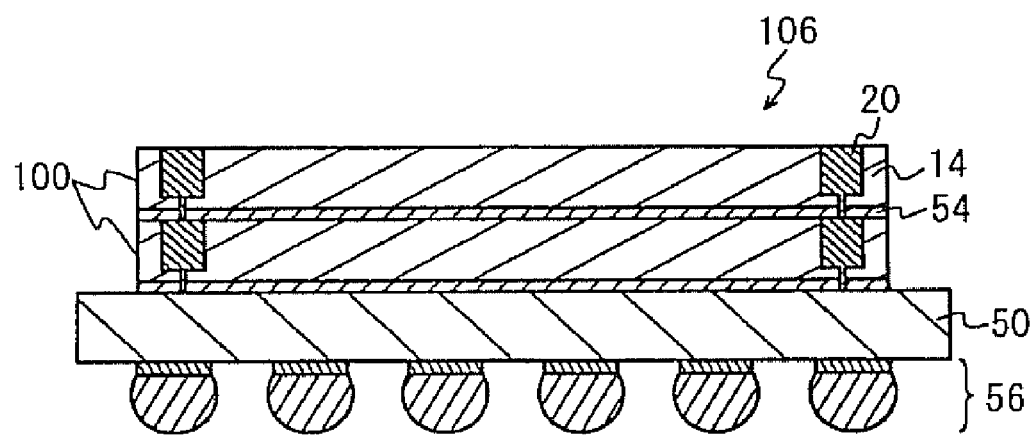
FIG. 11 is a sectional view showing a structure of a semiconductor device according to a sixth embodiment.

In a sixth embodiment, the semiconductor device 100 according to the first embodiment is stacked on the interposer. FIG. 11 is a sectional view showing the structure of a semiconductor device 106 according to the sixth embodiment. The semiconductor device 100 is stacked on an interposer 50 formed of the silicon resin, for example, by directing the surface of the interconnection layer 16 downward. The vertically stacked semiconductor devices 100 are electrically coupled via the respective through electrodes 20 formed therein. Outer connection terminals 56 each formed of a pad electrode and a solder ball are formed on the lower surface of the interposer 50.

Figure 12:
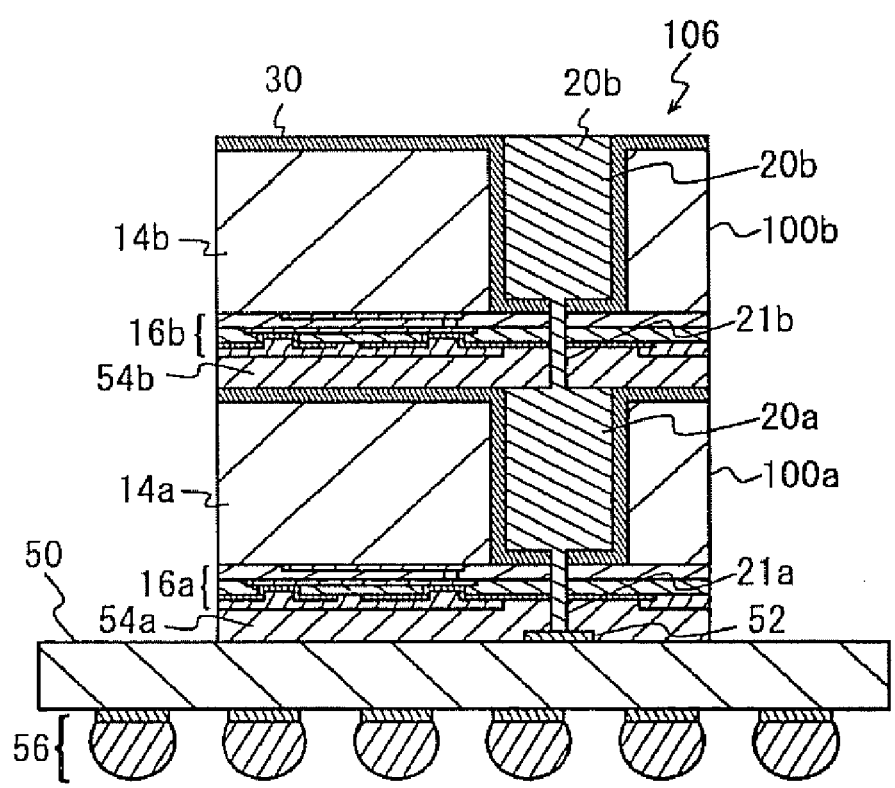
FIG. 12 is a sectional view showing an enlarged portion of the view shown in FIG. 11.

FIG. 12 is a sectional view showing an enlarged portion of the through electrode shown in FIG. 11. The scale of the view showing the interposer 50 and the outer connection terminal 56 is the same as the one of the view shown in FIG. 11. The bump 21a of the through electrode 20a is connected to an electrode 52 formed on the upper surface of the interposer 50. The space between the semiconductor device 100a and the interposer 50 is filled with an underfill agent 54a. The underfill agent 54a is used to stably fix the semiconductor device 100a on the interposer 50 and formed of the organic insulating resin, for example.

The semiconductor device 100b is mounted on the semiconductor device 100a by directing the surface of the interconnection layer 16b downward. The bump 21b of the through electrode 20b is connected to the through electrode 20a of the semiconductor device 100a. The space between the semiconductor devices 100b and 100a is filled with the underfill agent 54b. In this manner, the plurality of the semiconductor devices 100a and 100b are stacked on the upper surface of the interposer 50 by directing each surface of the interconnection layer 16 downward.

In the semiconductor device 106 according to the sixth embodiment, the bump 21 of the through electrode 20 is connected to the side opposite the bump-forming surface of another through electrode 20 such that the vertically stacked semiconductor devices are connected with each other via the through electrode 20. The plurality of the vertically stacked semiconductor devices 100 may be mounted on the interposer 50, thus enhancing the packaging density of the semiconductor device. The bump 21 protruding outside the semiconductor device 100 is capable of absorbing the irregularity of the mounted surface, even if the mounted surface is not flat. Therefore, the semiconductor device 100 may be stably mounted.

In the sixth embodiment, the semiconductor devices 100 according to the first embodiment are stacked on the interposer 50. However, the semiconductors 102 to 105 according to the second to the fifth embodiments, or any combination thereof may also be stacked.

Figure 13:
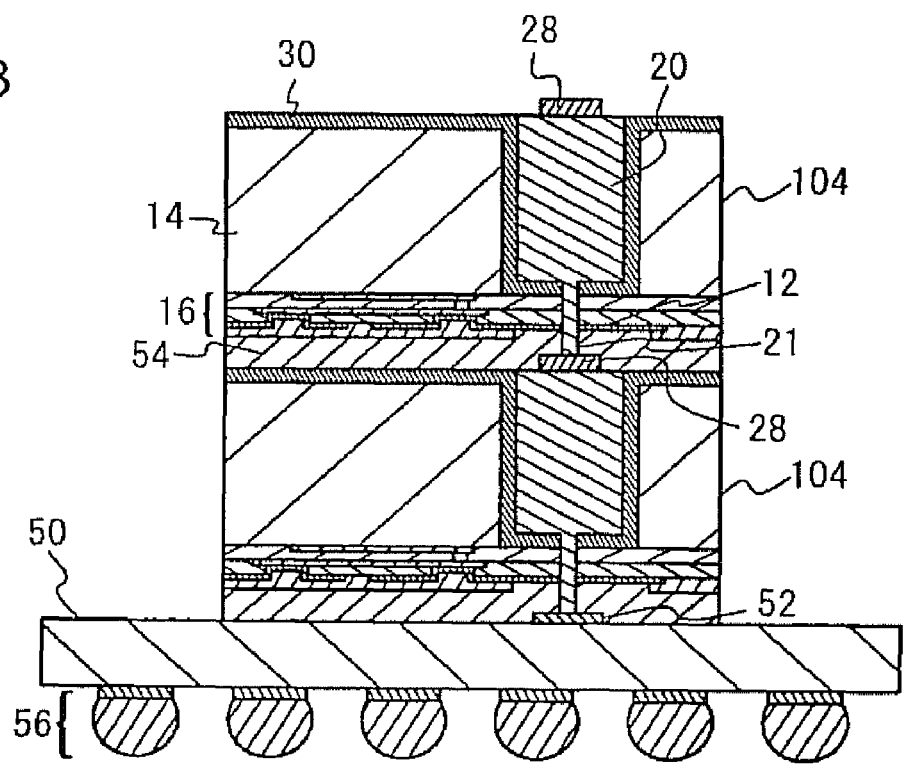
FIG. 13 is a sectional view showing a structure of another semiconductor device according to the sixth embodiment (part 1)

FIG. 13 shows a case where the plurality of the semiconductor devices 104 according to the fourth embodiment are stacked on the interposer 50. The structures are the same as those shown in FIG. 12 except that the through electrode 20 is provided with a second bonding bump 28. The bump 21 of the through electrode 20 is connected to the second bonding bump 28 provided on another through electrode. The through electrodes 20 may be connected with each other via the second bonding bump 28 to improve the connection stability.

Figure 14:
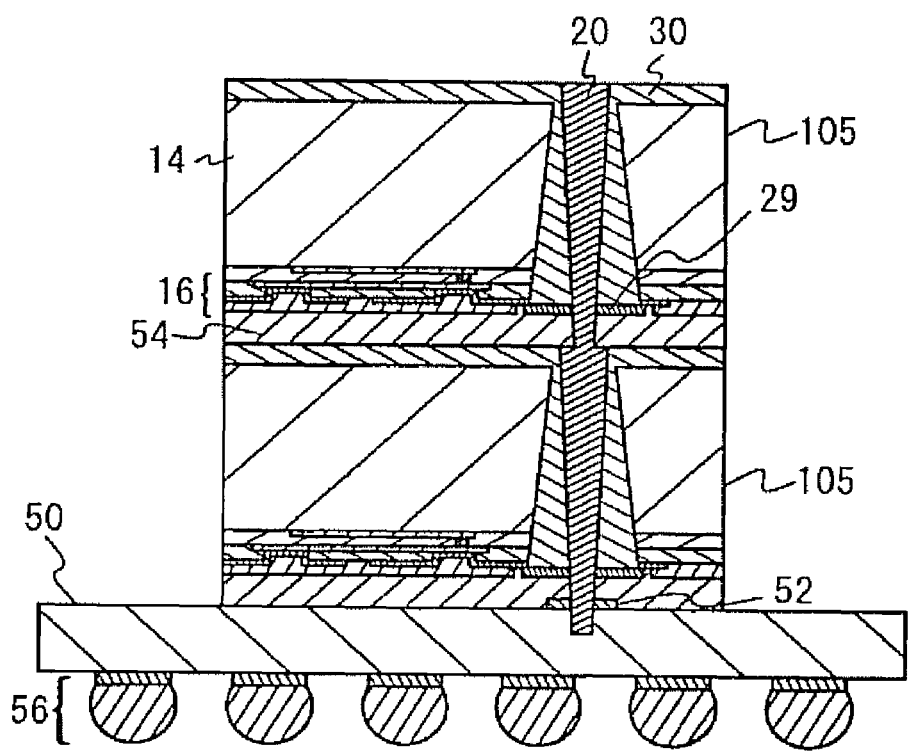
FIG. 14 is a sectional view showing a structure of another type of the semiconductor device according to the sixth embodiment (part 2).

FIG. 14 shows a case where the plurality of the semiconductor devices 105 according to the fifth embodiment are stacked on the interposer 50. The structures are the same as those shown in FIG. 12 except that the first through hole 32 is tapered in the direction from the upper portion to the lower portion, and the second through hole 34 is tapered in the direction from the lower portion to the upper portion. As the second through 34 hole may be formed by etching from the side opposite the first through hole 32, the conduction between the through electrode 20 and the semiconductor substrate 14 inside the first through hole 32 is unlikely to occur. This makes it possible to boost the yield of the semiconductor device.

Referring to FIGS. 12 to 14, two units of the semiconductor devices are stacked on the interposer 50. However, three or more units of the semiconductor devices may be stacked. The interposer 50 is used as a portion on which any of the semiconductor devices 100 to 105 are mounted. However, the mounted portion may be formed of any member so long as it functions for mounting the any of the semiconductor devices 100 to 105.

Now, several aspects of the present invention are summarized below.

According to an aspect of the present invention, there is provided a semiconductor device which includes a semiconductor substrate, a connection electrode disposed on an upper surface of the semiconductor substrate and connected to an integrated circuit on the semiconductor substrate, a through electrode which penetrates the semiconductor substrate and the connection electrode, and an insulation portion interposed between the semiconductor substrate and the through electrode. The through electrode is integrally formed to protrude outward from upper surfaces of the semiconductor substrate and the connection electrode, and connected to the connection electrode in a region where the through electrode penetrates the connection electrode. In the invention, the through electrode is connected to the connection electrode, and protrudes from the upper surfaces of the semiconductor substrate and the connection electrode. This makes it possible to easily connect the semiconductor device to another semiconductor device or the interposer. In addition, as the through electrode may be integrally formed, the manufacturing step of the semiconductor device may be simplified, and the manufacturing cost may further be reduced.

In the aforementioned structure, the semiconductor substrate includes a first through hole which penetrates the semiconductor substrate, and a second through hole which vertically penetrates the insulation portion inside the first through hole. The insulation portion is disposed inside the first through hole, and the through electrode is disposed inside the second through hole.

In the aforementioned structure, the insulation portion may be formed to fill the first through hole. This makes it possible to effectively insulate the semiconductor substrate from the through electrode inside the first through hole.

In the aforementioned structure, the first through hole may be tapered in a direction from the upper surface to a lower surface of the semiconductor substrate, and the second through hole may be tapered from the lower surface to the upper surface of the semiconductor substrate. The structure allows the semiconductor substrate to be insulated from the through electrode inside the first through hole further effectively.

In the aforementioned structure, the through electrode may be tapered in the direction from the lower surface to the upper surface of the semiconductor substrate.

In the aforementioned structure, the insulation portion may be formed as a film applied to the inner surface of the first through hole. This makes it possible to form the insulation portion as a thin film.

The aforementioned structure is provided with at least one of a first bonding bump formed on an upper surface of the through electrode and a second bonding bump formed on a lower surface of the through electrode. The structure allows the through electrode to be connected to another semiconductor device or the interposer further easily using the first or the second bonding bump.

According to another aspect of the present invention, there is provided a method for manufacturing a semiconductor device including steps of bonding a first support member formed of a support base material and a support adhesive agent on an upper surface of a semiconductor substrate provided with a connection electrode by directing the support adhesive agent downward, forming a first through hole which penetrates the semiconductor substrate, forming an insulation portion inside the first through hole, forming a second through hole which vertically penetrates the insulation portion and the connection electrode, and further penetrates the support adhesive agent inside the first through hole, and integrally forming a through electrode in a region corresponding to the semiconductor substrate, the connection electrode and the support adhesive agent inside the second through hole. In the method, the through electrode which protrudes from the upper surfaces of the semiconductor substrate and the connection electrode, and is connected to the connection electrode may be manufactured in the single step. This makes it possible to simplify the manufacturing step, and to reduce the manufacturing cost.

In the method, the first support member may be provided with a stopper layer interposed between the support base material and the support adhesive agent, and the step of forming the second through hole includes forming the second through hole which penetrates the insulation portion, the connection electrode and the support adhesive agent from a lower surface of the semiconductor substrate to reach the stopper layer. This method makes it possible to prevent overetching of the support base material in the step of forming the second through hole because the stopper layer serves to prevent etching.

The method may include a step of forming a first bonding bump in a region corresponding to the support adhesive agent inside the second through hole. This method makes it possible to form the first bonding bump on the upper surface of the through electrode without additionally forming the mask, thus reducing manufacturing cost further.

The method may include a step of bonding a second support member to a lower surface of the semiconductor substrate, and a step of forming a second bonding bump to a lower surface of the through electrode after eliminating the support adhesive agent and the support base material. The step of forming the second through hole includes forming the second through hole which penetrates the second support member, the insulation portion, the connection electrode, and the support adhesive agent inside the first through hole. The method allows the second bonding bump to be formed on the lower surface of the through electrode.

In the method, the step of forming the through electrode includes forming the through electrode using the second support member as the mask. The step of forming the second bonding bump includes forming the second bonding bump using the second support member as the mask. In the method, the through electrode and the second bonding bump may be formed using the second support member as the mask. The resultant manufacturing step may be simplified, and the manufacturing cost may be reduced.

In the method, the step of forming the first through hole includes eliminating the semiconductor substrate in a direction from an upper surface to a lower surface thereof, and the step of forming the second through hole includes eliminating the insulation portion, the connection electrode and the support adhesive agent in the direction from the lower surface to the upper surface of the semiconductor substrate. The method is capable of preventing the side surface of the insulation portion from being cut erroneously upon formation of the second through hole. The conduction between the semiconductor substrate and the through electrode inside the first through hole may be suppressed.

In the method, a plurality of the above-structured semiconductor devices are stacked, and vertically stacked semiconductor devices among the plurality of the semiconductor devices are connected with each other via the through electrode. The method is capable of connecting the vertically stacked semiconductor devices using the through electrode. This makes it possible to easily stack the semiconductor devices.

In the aforementioned method, the through electrodes of the plurality of the semiconductor devices may be connected with each other via the bonding bump. This makes it possible to connect the through electrodes further reliably using the bonding bump.

In the present invention, the through electrode protruding from the upper surfaces of the semiconductor substrate and the connection electrode allows the semiconductor device to be connected to another semiconductor device or the interposer. As the through electrode may be integrally formed, the method for manufacturing the semiconductor device may be simplified, thus reducing the manufacturing cost.

While the preferred embodiments of the present invention have been described in details above, the present invention is not limited to those specific embodiments, and within the spirit and scope of the present invention, various modifications and alterations can be made.

We claim:

1. A semiconductor device comprising:
   a semiconductor substrate;
   a connection electrode connected to an integrated circuit on the semiconductor substrate;
   a through electrode which penetrates the semiconductor substrate and the connection electrode; and
   an insulation portion interposed between the semiconductor substrate and the through electrode, wherein
   the through electrode is connected to the connection electrode in a region where the through electrode penetrates the connection electrode.

2. The semiconductor device according to claim 1, wherein:
   the semiconductor substrate includes a first through hole which penetrates the semiconductor substrate, and a second through hole which vertically penetrates the insulation portion inside the first through hole;
   the insulation portion is disposed inside the first through hole; and
   the through electrode is disposed inside the second through hole.

3. The semiconductor device according to claim 2, wherein:
   the first through hole is tapered in a direction from the upper surface to a lower surface of the semiconductor substrate;
   the insulation portion is formed to fill the first through hole; and
   the second through hole is tapered from the lower surface to the upper surface of the semiconductor substrate.

4. A method of manufacturing a semiconductor device comprising:
   bonding a first support member formed of a support base material and a support adhesive agent on an upper surface of a semiconductor substrate provided with a connection electrode by directing the support adhesive agent downward;
   forming a first through hole which penetrates the semiconductor substrate;
   forming an insulation portion inside the first through hole;
   forming a second through hole which vertically penetrates the insulation portion and the connection electrode, and further penetrates the support adhesive agent inside the first through hole; and
   forming a through electrode in a region corresponding to the semiconductor substrate, the connection electrode and the support adhesive agent inside the second through hole.

5. The method of manufacturing the semiconductor device according to claim 4, wherein:
   the first support member is provided with a stopper layer interposed between the support base material and the support adhesive agent; and
   forming the second through hole includes forming the second through hole which penetrates the insulation portion, the connection electrode and the support adhesive agent from a lower surface of the semiconductor substrate to reach the stopper layer.

6. The method for manufacturing the semiconductor device according to claim 4, further comprising a first bonding pump in a region corresponding to the support adhesive agent inside the second through hole.

7. The method for manufacturing the semiconductor device according to claim 4, further comprising:
   bonding a second support member to a lower surface of the semiconductor substrate; and forming a second bonding bump to a lower surface of the through electrode using the second support member as a mask after eliminating the support adhesive agent and the support base material, wherein:
forming the second through hole includes forming the second through hole which penetrates the second support member, the insulation portion, the connection electrode, and the support adhesive agent inside the first through hole; and
forming the electrode includes forming the through electrode using the second support member as the mask.

8. The method for manufacturing the semiconductor device according to claim 4, wherein:
forming the first through hole includes eliminating the semiconductor substrate in a direction from an upper surface to a lower surface thereof; and
forming the second through hole includes eliminating the insulation portion, the connection electrode and the support adhesive agent in the direction from the lower surface to the upper surface of the semiconductor substrate.

9. The semiconductor device according to claim 1, wherein:
the connection electrode is disposed on an upper surface of the semiconductor substrate.

10. The semiconductor device according to claim 1, wherein: the through electrode is integrally formed.

11. The semiconductor device according to claim 1, wherein:
the through electrode protrudes outward from an upper surface of the semiconductor substrate and the connection electrode.

12. The method of manufacturing the semiconductor device according to claim 4, further comprising:
forming the through electrode integrally.

13. The semiconductor device according to claim 3 wherein:
the insulation portion may be formed as a film applied to the inner surface of the first through hole.

14. The semiconductor device according to claim 11, further comprising at least one of a first bonding bump formed on an upper surface of the through electrode and a second bonding bump formed on a lower surface of the through electrode.

15. A semiconductor device wherein:
a plurality of the semiconductor devices according to claim 11 are stacked; and
vertically stacked semiconductor devices among the plurality of the semiconductor devices are connected with each other via the through electrode.

16. A semiconductor device wherein:
a plurality of the semiconductor devices according to claim 14 are stacked; and
the through electrode of vertically stacked semiconductor devices among the plurality of the semiconductor devices are connected with each other via the bonding bump.

\* \* \* \* \*